United States Patent [19]

Strawn

[11] Patent Number: 5,448,507
[45] Date of Patent: Sep. 5, 1995

[54] REDUCED LOGIC CORRELATOR

[75] Inventor: David F. Strawn, Marietta, Ga.

[73] Assignee: Digital Wireless Corporation, Atlanta, Ga.

[21] Appl. No.: 84,978

[22] Filed: Jun. 25, 1993

[51] Int. Cl.⁶ .................... G06F 15/336; G06F 15/31
[52] U.S. Cl. .................. 364/728.06; 364/724.11
[58] Field of Search ............ 364/728.06, 728.03, 364/715.11, 724.11

[56] References Cited

U.S. PATENT DOCUMENTS

| | | | |
|---|---|---|---|
| 3,167,738 | 1/1965 | Westerfield | 364/724.11 |
| 3,458,694 | 7/1969 | Whitehouse et al. | 364/728.06 |
| 3,670,151 | 6/1972 | Lindsay et al. | 364/728.06 |
| 3,760,355 | 9/1973 | Bruckert | 340/146.2 |
| 4,244,029 | 1/1981 | Hogan et al. | 364/728.06 |
| 4,285,046 | 8/1981 | Henry | 364/728 |
| 4,771,264 | 9/1988 | Childers | 340/146.2 |
| 4,829,462 | 5/1989 | Freeman | 364/715.11 |

OTHER PUBLICATIONS

Rappaport et al, "Spread-Spectrum Signal Acquisition: Methods and Technology", *IEEE Communications Magazine*, vol. 22, No. 6, Jun. 1984, pp. 6-21.

*Primary Examiner*—Tan V. Mai
*Attorney, Agent, or Firm*—Pollock, Vande Sande & Priddy

[57] ABSTRACT

An improved correlator or matched filter for binary coefficients is provided which reduces the amount of logic required to indicate the receipt of a predetermined code word. The matched filter includes a plurality of stages of delay, where the number of stages in the delay is preferably equal to the product of the number of chips in the code word and the number of times each chip is sampled. Logic input locations are selected corresponding to transitions in the code word. Digital logic responds to signals available at each logic input for generating data indicating the change in the degree of match between the received signal samples and the code word. An integrator is the last element in the logic and is provided with the foregoing change information. The output of the integrator is then an indication of the degree of match between the most recent set of signal transitions corresponding to the number of transitions in the sampled code word and the code word itself.

14 Claims, 3 Drawing Sheets

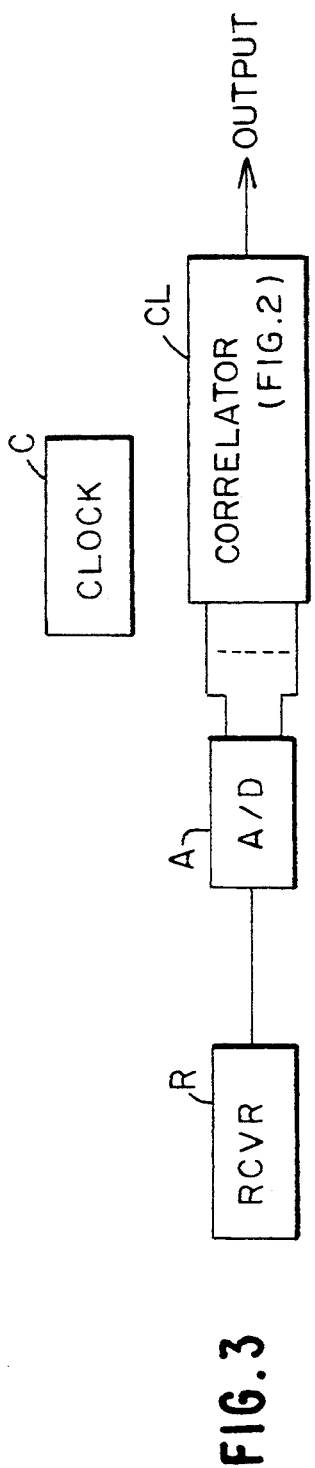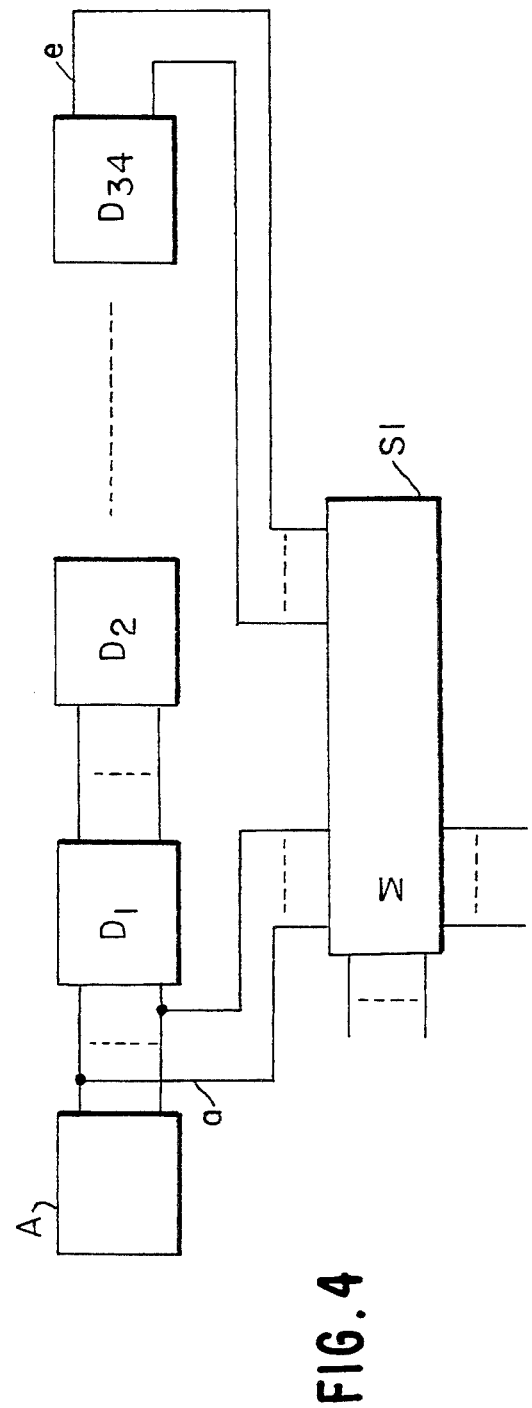

5,448,507

REDUCED LOGIC CORRELATOR

TECHNICAL FIELD

The invention relates to the field of correlation, and more particularly, a correlator implemented with a minimal quantum of hardware.

BACKGROUND

Correlation is used in a number of areas, a popular application for correlation is the demodulation of direct sequence spread spectrum data. Correlators used in this application are also referred to as a "matched filter", or sometimes a "passive correlator". The hardware typically consists of a serial sequence of delay elements of width n bits, through which a digitized representation of the baseband signal passes. The width of the delay elements, n, is generally the number of significant bits produced in the sampling process. The juncture or boundaries of the delay elements are referred to as "logic inputs". The logic inputs are assigned positive or negative weights, so as to provide a good match to the code word in use. The output of the correlator is the weighted sum of all or some subset of the logic inputs.

Bruckert describes, in U.S. Pat. No. 3,760,355, a digital pattern detector which is in fact a correlator. The correlator described in U.S. Pat. No. 3,760,355 requires the use of a multi-input accumulator which is capable of assigning different weights to different inputs. The patent also uses a digital representation of the pattern to be matched and does a bit-by-bit comparison. The present invention simplifies the hardware which is required, eliminates the need for the bit-by-bit comparison (and the register storing the pattern), and allows the use of higher than single bit precision.

SUMMARY OF THE INVENTION

The present invention improves and simplifies prior art correlators by taking advantages of redundancies in the code word to which the correlator is targeted. More particularly, rather than providing signal processing devices connected to the interface between each of the delay stages of the filter, logic inputs are only connected to selected locations. Information derived from each of the selected logic inputs is processed in logic which is configured to match the code word. More particularly, in accordance with one aspect of the invention, a matched filter with binary coefficients for a predetermined code word is provided which includes:

delay means with the number of elements at least equal to the number of chips in the code word for delaying an input stream by a unit measure of delay for each element;

a plurality of logic inputs on said delay means, said logic inputs located only at locations exhibiting code word transitions; and digital logic comprising a plurality of adders and an integrator, at least some of said adders with inputs coupled to said logic inputs and an output of the filter comprising an output of the integrator.

In accordance with another aspect, the invention provides a matched filter with binary coefficients personalized for a given binary code word comprising:

a first delay element with an input for accepting a digital stream for detection of the given code word, said delay element having a number of discrete delays equal to at least the number of chips in the code word and a selected number of logic inputs less than the number of chips in the code word;

logic means coupled to the logic inputs, the logic means implementing an algebraic expression with the number of terms equal to one less than the number of runs in the code word, each term comprising a difference of elements representing a beginning and end of a corresponding run with a coefficient of one of two signs, one sign representing a transition of one type in the code word and the other sign representing a transition of another type; and an integrator with an input coupled to an output of the logic means and an output forming an output of the matched filter.

BRIEF DESCRIPTION OF THE DRAWINGS

The present invention will now be described in further detail in the following portions of this specification when taken in conjunction with the attached drawings, in which:

FIG. 3 is a block diagram showing the particular environment within which the correlator of the present invention can be used; and FIG. 4 is a detail of portions of FIG. 2 showing the multibit data paths interconnecting the various elements employed in the invention.

DETAILED DESCRIPTION OF PREFERRED EMBODIMENTS

FIG. 3 is a block diagram showing the typical environment in which the invention may be employed. More particularly, FIG. 3 shows components of a receiver in a communications system which may employ spread spectrum modulation. The correlator CL (shown in more detail in FIG. 2) is used to extract, from the transmitted information, the information which was originally employed in a spread spectrum modulation process, at a transmitter. More particularly, FIG. 3 shows a receiver R, an A/D converter A, the correlator CL and a clock C. Although not shown in FIG. 3, outputs of the clock C may be used at the other components of FIG. 3, for example at the A/D converter A and the correlator CL. Output data from the receiver R is fed to the A/D converter A where it is converted to multi-bit digital form. The rate at which the receiver output data is sampled may be controlled by the output of the clock C. Accordingly, at the rate established by the clock C, the correlator CL has input thereto data samples, where each sample includes the number of bits established by the output of the A/D converter A. As will be described below, the correlator CL in effect compares the data applied thereto against a predetermined code word and generates an output as a consequence of the correlation between the input data and the code word.

Figure 1:
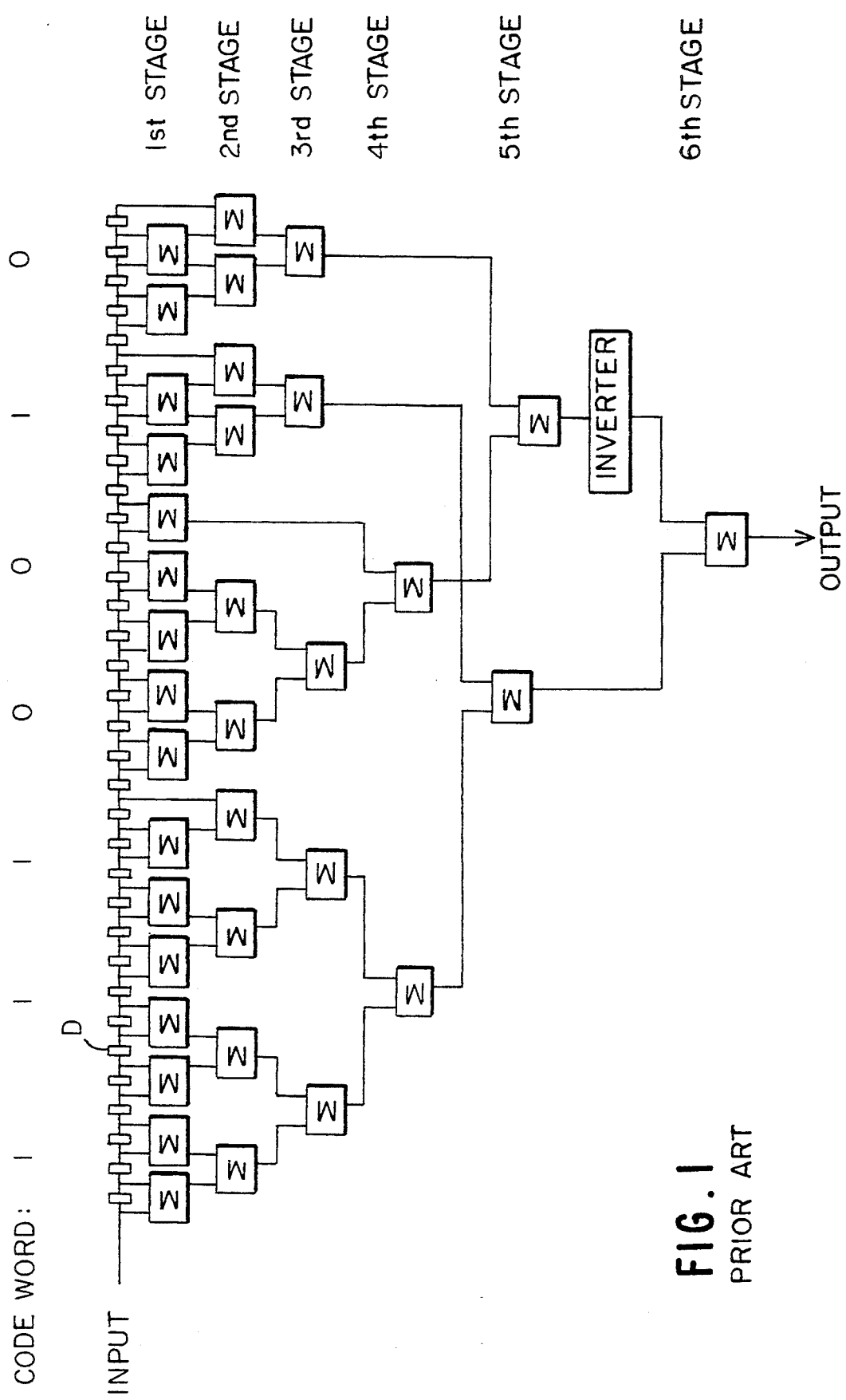
FIG. 1 is a block diagram of a typical prior art correlator which is improved in accordance with the present invention.

Before describing a preferred embodiment of the invention, reference is made to FIG. 1 which illustrates a typical correlator which could be used in the demodulation of a direct sequence spread spectrum signal. The advantages of the invention will be described by comparing the hardware required in the correlator of FIG. 1 to the reduced quantum of hardware required with the correlator employing the present invention which is illustrated in FIG. 2.

Referring to FIG. 1, the correlator consists of a cascaded series of unit delay elements D. The length of the filter or correlator is equal to the number of delay elements plus 1. The correlator input, and the outputs of each of the elements are called taps. The value output at each tap is multiplied by a binary coefficient and summed so that the output of the filter is a weighted sum of all of the taps. This architecture is illustrated in FIG. 1, which illustrates a sequence of 34 delay elements whose inputs/outputs are referred to as taps. The value available at each of the logic inputs T is input to a selected one of a plurality of first stage summing devices S. The outputs of the first stage of the summing devices are summed in second, third, fourth, fifth and sixth stage summing devices, respectively, to produce the output. At least n+1 adders are required for n taps; FIG. 1 shows 36 adders and 35 taps. The coefficients are restricted to binary values (for example 1 and −1) and are selected so as to correspond to the particular code word, i.e. a coefficient of 1 corresponds to a 1 chip, and a −1 coefficient corresponds to a 0 chip. This is in contrast to some passive correlators which employ non-unity coefficients which are not within the scope of this invention. As is well known in the spread spectrum field, in the modulation process, each information bit is multiplied by the code word which is typically made up of a plurality of elements which are referred to as chips so as to distinguish them from information bits. The length of the filter is the number of chips in the code word multiplied by the number of samples per chip. For an 11-chip code word which is sampled at a sampling rate which is 7 times the chip rate, the passive correlator would require 77 taps. The example shown in FIG. 1 is that of a 7-chip code word (0100111) which is sampled five times per chip, producing a correlator with 35 taps.

Typically, the code word is fixed or the correlator is designed for the code word and there is no requirement that the code word be modified during the course of operation. Under these circumstances, a reduction in logic can be achieved. This advantage comes about by taking advantage of instances of contiguous delay segments wherein the logic input coefficients are identical. In these cases, it is not necessary to sum all the individual elements in the run. Instead, by taking note of the sum of the logic inputs within the contiguous extent when the filter is first initialized, a running sum may be obtained by adding the numbers entering a given run and subtracting the numbers existing from the same run. By properly summing the change over all runs, the single change quantity is then applied to an integrator. The integrator maintains an integrated change quantity. In this way, an integrator can be substituted for a number of adders, as determined by the length of the extent. Further benefits become apparent once a specific code word has been selected and logic reduction techniques are applied to the correlator as a whole. For the code word which is illustrated in FIG. 1, there are four extents over which the tap coefficients are the same. These extents are 111, 00, 1 and 0. Since there are five taps per chip, the four extents are composed of the following numbers of taps, e.g. the 111 extent covers 15 taps (3×5). The 00 extent covers 10 taps and each of the other two extents covers 5 taps.

Figure 2:
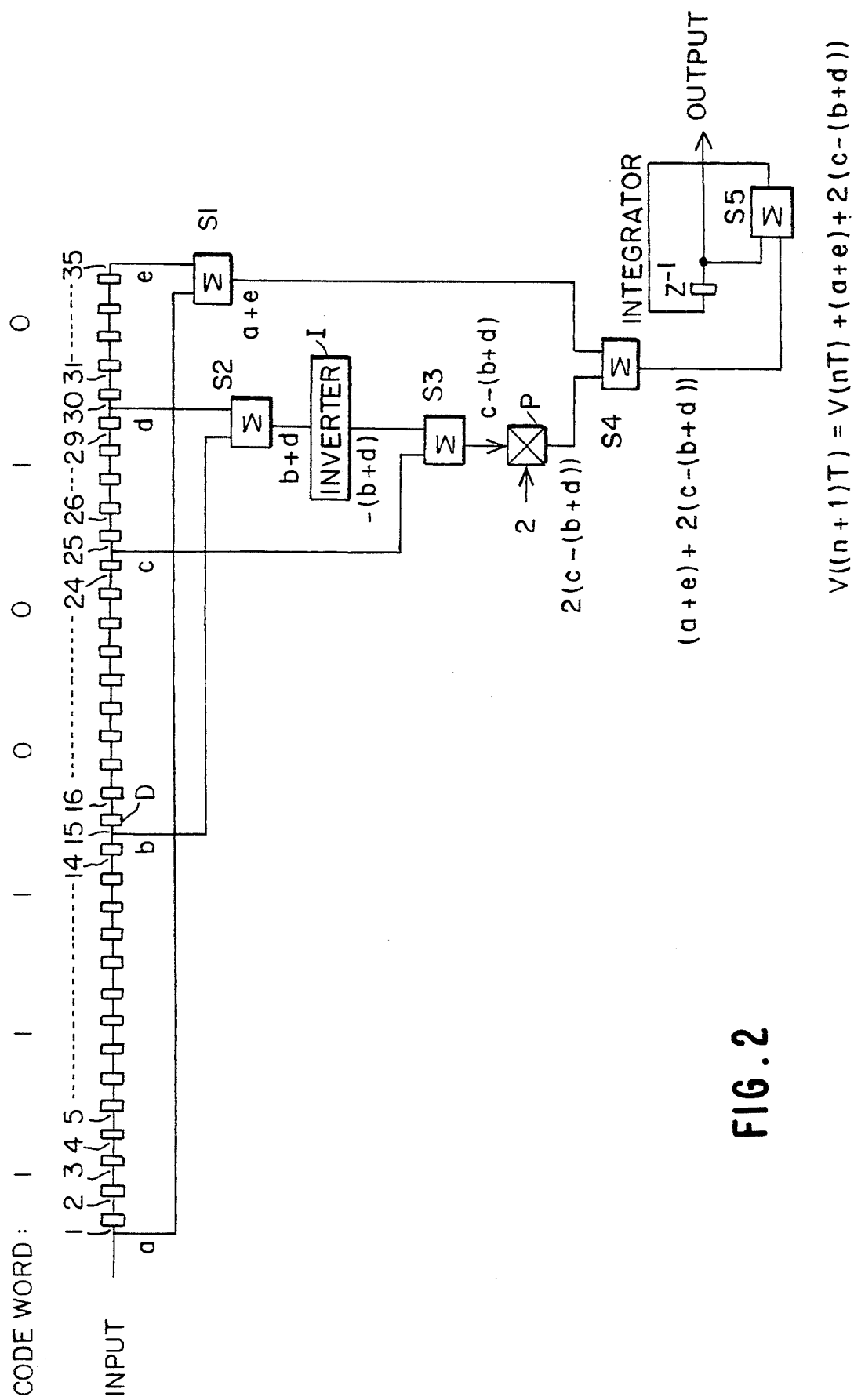
FIG. 2 is a block diagram of a preferred embodiment of the invention illustrating a correlator which performs the same correlation as that of FIG. 1 but with significantly reduced hardware.

FIG. 2 illustrates a correlator designed for the identical code word of FIG. 1, which takes advantage of the invention by minimizing the logic required to produce the same output as that which is produced by the correlator of FIG. 1.

More particularly, the correlator of FIG. 2 uses 5 summing devices (S1 through S5), an inverter I, a device to multiply an input by a factor of 2 (a shifter) P, to add a zero at the right of a binary value to shift it one digit or multiply the value by two, and a delay stage Z, in lieu of 36 summing devices and the inverter of FIG. 1. Of these devices, the integrator includes one summing device (S5) and the delay stage Z.

In order to implement the correlator of FIG. 2, a logic input is placed in the delay sequence at the beginning and end of each extent. FIG. 2 shows logic inputs a, b, c, d and e which are placed at the appropriate locations. In order to relate the output of the correlator at a given bit time to the output at the succeeding bit time, it can be noted that $V((n+1)T)=V(nT)+$ the change in the output.

The change in the output can be represented, in terms of the quantities at each of the logic inputs a to e as:

$$+1(a-b)+(-1)(b-c)+1(c-d)+(-1)(d-e) \quad (1)$$

The term (a-b) is the change over the extent 111. Since the extent contains 1 chips, the sign coefficient is +1. The term (b-c) is the change over the extent 00. Since the extent contains 0 chips, the sign coefficient is −1. The other term can be analyzed in a similar fashion.

Having derived the expression (1), conventional algebra enables us to collect terms and rewrite the expression as:

$$(a+e)+2(c-(b+d)) \quad (2)$$

The reader can verify that the output of the summer S4 represents this expression. The output of the summer S4 is provided as one input to the summing device S5. The other input to the summing device comes from the delay stage Z which represents V(nT) so that the output of the summing device represents:

$$V((n+1)T)=V(nT)+(a+e)+2(c-(b+d)) \quad (3)$$

FIG. 4 is a schematic illustration of the actual interconnections of selected ones of the delay stages d1–d34, the analog to digital converter A and a summer S1. In a preferred embodiment of the invention, each sample is digitized to a resolution of four bits so that on each clock pulse, when the A to D converter A produces a new output and the contents of each of the delay stages d1–d33 are shifted one stage to the right, four bits are transferred. Thus, there is a 4-bit interface between the output of the analog to digital converter A and the input of the first delay stage D1. The logic input a also provides four bits to the summing device S1. Whereas the data provided to the summing device S1 from logic input a comprises the input to the delay stage D1, the logic input e provides to the same summing device S1 the output of the delay stage $D_{34}$. The summing device S1 produces the sum:

$$\frac{\begin{array}{cccc}a_3 & a_2 & a_1 & a_0\\ d_3 & d_2 & d_1 & d_0\end{array}}{\begin{array}{cccc}s_{13} & s_{12} & s_{11} & s_{10}\end{array}}$$

While a preferred embodiment of the present invention has been described in detail, those skilled in the art should understand that many changes can be made within the spirit and scope of the invention. Whereas, for example, in FIG. 2 each of the logic inputs are connected to an adder, that is not essential to the invention and, depending upon the particular logic which is implemented, one of the logic inputs can be connected to an inverter, a multiplier or the like.

What is claimed is:

1. A matched filter with binary coefficients for a predetermined code word comprising:
   a) delay means with a number of elements at least equal to the number of chips in the code word for delaying a digital input stream by a unit measure of delay for each said element,
   b) a plurality of logic inputs on said delay means, said logic inputs located only at locations exhibiting code word transitions, and
   c) digital logic comprising a plurality of adders and an integrator, at least some of said adders with inputs coupled to said logic inputs and an output of the filter comprising an output of said integrator.

2. A matched filter as recited in claim 1 which further includes:
   i) sampling means with an output coupled to an input of said delay means, said sampling means sampling a digital stream at a rate which is a multiple n of a bit rate of the digital stream to produce n samples per bit time, where n is a positive integer greater than unity,
   ii) said delay means having a number of elements one less than the product of the number of chips in the code word and n, and
   iii) wherein said logic inputs are located at sample transitions of said sampled code word.

3. A matched filter as recited in claim 2 wherein each said sample has a multi-bit resolution.

4. A matched filter as recited in claim 2 wherein each said adder has a multi-bit resolution.

5. A device as recited claim 1 or claim 2 or claim 3 wherein some of said adders have two inputs from said logic inputs and wherein each said adder has inputs from logic inputs exhibiting an identical transition when the code word is located in said delay means.

6. A correlator with binary coefficients personalized for a given code word and given number of samples per chip comprising:
   a) delay means with a number of elements one less than the product of the number of chips in the code word and the number of samples per chip,
   b) a plurality of logic inputs on said delay means, said logic inputs located only at locations exhibiting sampled code word transitions, and
   c) digital logic comprising a plurality of adders and an integrator, at least some of said adders with inputs coupled to said logic inputs and an output of the filter comprising an output of said integrator.

7. A correlator as recited in claim 6 wherein said delay means, said logic inputs and said digital logic has a multi-bit resolution.

8. A device as recited in claim 6 wherein said integrator comprises a latch and an adder.

9. A matched filter with binary coefficients personalized for a given binary code word comprising:
   a) a first delay with an input for accepting a digital stream for detection of the given code word, said delay having a number of discrete delays equal to at least the number of chips in the code word and a selected number of logic inputs less than the number of the chips in the code word,
   b) logic means coupled to said logic inputs, said logic means implementing an algebraic expression with a number of terms equal to one less than the number of runs in the code word, each term comprising a difference of elements representing a beginning and end of the corresponding run with a coefficient of one of two signs, one sign representing a transition of one type in the code word and the other sign representing a transition of another type, and
   c) an integrator with an input coupled to an output of the logic means and an output forming an output of the matched filter.

10. A matched filter as recited in claim 9 wherein said input to the first delay is a representation of a digital stream sampled at n samples per bit, where n is a positive integer greater than unity, said number of discrete delays of said first delay one less than the product of the number of chips in the code word and n, and wherein said first delay has a number of logic inputs equal to the number of transitions in the code word.

11. A matched filter as recited in claim 10 wherein said logic means includes a plurality of adders, some of said adders with two inputs from logic delays of said first delay and wherein each said some of said adders has inputs from logic inputs exhibiting an identical transition when the code word is located in said first delay element.

12. A matched filter as recited in claim 11 wherein said integrator comprises a second delay and a further adder, an output of the second delay connected to one input of the further adder.

13. A matched filter as recited in claim 11 wherein said first delay, each of said discrete delays, said logic means, said integrator have multi-bit resolution and said plurality of adders have multi-bit resolution.

14. A matched filter as recited in claim 9 wherein said first delay, each of said discrete delays, said logic means and said integrator have multi-bit resolution.

* * * * *